(12) United States Patent
Becker et al.

(10) Patent No.: US 7,052,623 B1
(45) Date of Patent: May 30, 2006

(54) METHOD FOR PROCESSING SILICON USING ETCHING PROCESSES

(75) Inventors: Volker Becker, Marxzell (DE); Franz Laermer, Stuttgart (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/581,663

(22) PCT Filed: Sep. 22, 1999

(86) PCT No.: PCT/DE99/03018

§ 371 (c)(1),
(2), (4) Date: Aug. 3, 2000

(87) PCT Pub. No.: WO00/23376

PCT Pub. Date: Apr. 27, 2000

(30) Foreign Application Priority Data

Oct. 15, 1998 (DE) ............................... 198 47 455

(51) Int. Cl.
*H01L 21/00* (2006.01)
(52) U.S. Cl. ..................... 216/67; 216/17; 216/41; 216/99; 438/719; 438/733; 438/739; 438/745; 438/753
(58) Field of Classification Search ................ 216/17, 216/41, 67, 99; 438/719, 733, 739, 745, 438/753
See application file for complete search history.

(56) References Cited

U.S. PATENT DOCUMENTS

| | | | | |
|---|---|---|---|---|
| 4,310,380 A | * | 1/1982 | Flamm et al. | ......... 204/192.32 |
| 4,330,384 A | * | 5/1982 | Okudaira et al. | ........... 204/192 |
| 5,313,836 A | * | 5/1994 | Fujii et al. | ................ 73/514.16 |
| 5,683,908 A | * | 11/1997 | Miyashita et al. | ............ 437/67 |
| 5,728,259 A | * | 3/1998 | Suzawa et al. | ............. 438/164 |
| 6,211,092 B1 | * | 4/2001 | Tang et al. | ................. 438/719 |

FOREIGN PATENT DOCUMENTS

| | | |
|---|---|---|
| DE | 42 41 045 | 5/1994 |
| DE | 44 20 962 | 12/1995 |
| DE | 195 37 814 | 4/1997 |
| DE | 196 03 829 | 8/1997 |
| DE | WO 97 49998 | 12/1997 |

OTHER PUBLICATIONS

Wolf et al., "Silicon Processing For T;he VLSI REA" 1986, vol. 1, pp. 539-550.*

* cited by examiner

*Primary Examiner*—Shamim Ahmed
(74) *Attorney, Agent, or Firm*—Kenyon & Kenyon LLP

(57) ABSTRACT

A method is proposed for etching a first silicon layer (15) that is provided with an etching mask (10) for defining lateral recesses (21). In a first plasma etching process, trenches (21') are produced in the region of the lateral recesses (21) by anisotropic etching. The first etching process comes virtually to a standstill as soon as a separating layer (12, 14, 14', 16), buried between the first silicon layer (15) and a further silicon layer (17), is reached. This separating layer is thereupon etched through in exposed regions (23, 23') by a second etching process. A subsequent third etching process then etches the further silicon layer (17, 17'). In this manner, free-standing structures for sensor elements can be produced in a simple process which is completely compatible with the method steps in IC integration technology.

32 Claims, 4 Drawing Sheets

METHOD FOR PROCESSING SILICON USING ETCHING PROCESSES

BACKGROUND INFORMATION

The invention is based on a method for etching a silicon layered body as set forth by the species defined in the main claim.

The German laid open print 195 37 814 A1 describes a method for producing silicon layer systems, with which surface micromechanical sensors can be produced. To that end, deposited first on a silicon substrate is a thermal oxide upon which a thin layer of highly doped polysilicon is applied for use as a buried printed circuit trace. Deposited then on the polysilicon layer is a further oxide layer, and upon that, for example, a thick epipolysilicon layer. Finally, an aluminum metallization is deposited on the surface and patterned. The sensor structures to be exposed are subsequently etched out, preferably with a fluorine-based silicon deep-etching method described in the German patent 42 41 045. The sensor element is laid bare with the aid of a sacrificial-layer etching, in which the oxide below the sensor regions is removed by media containing hydrofluoric acid using a vapor-etching method. Disadvantages in this undercutting technique is that the oxide is removed not only under the sensor region to be exposed, but also above and partially even under the polysilicon printed circuit traces, so that there is the danger of shunts and leakage current. Protection of the oxide regions whose undercutting is to be prevented, for instance, by protective lacquers, is only possible with considerable expenditure, since vaporous hydrofluoric acid penetrates almost all practicable polymer protective layers very quickly, and moreover, can act very The German patent 44 20 962 A1 describes a dry-etching method in silicon for producing sensor structures by a combination of anisotropic and isotropic plasma-etching techniques. A subsequent wet-etching step or etching in the vapor phase is not necessary in this case. All the process steps can be carried out in one single plasma-etching installation. To that end, first of all, the sensor structure is produced with vertical walls with the aid of the anisotropic deep-etching method described in DE 42 41 045. In this context, deposition steps in which a Teflon-like polymer is deposited on the side wall, and fluorine-based etching steps which are isotropic as such and are made locally anisotropic by propelling the side-wall polymer during the etching, alternate. The silicon substrate is subsequently isotropically etched with a fluorine-based etching step until the silicon structure for the sensor element is completely exposed. However, this method has two serious disadvantages. On one hand, because of the "microloading effect", narrow etched trenches are etched more slowly than wide etched trenches, which then also holds true for the speed of the subsequent lateral undercutting, i.e., the undercutting progresses more slowly for narrow trenches than for wide trenches. Secondly, the structures to be exposed are also attached from their lower side or bottom. The result is that structures which are surrounded by wide trenches have less residual height than structures which are surrounded by narrow trenches, which frequently leads to unreproducible and unsatisfactory mechanical properties of the sensor elements produced.

SUMMARY OF THE INVENTION

The object of the present invention is to provide a method for etching silicon or silicon layers with which trenches, defined initially by an etching mask, can be etched anisotropically in a silicon layer. In this context, the etching depth achieved in the trenches should not be dependent on the width of the trenches, but rather only on the etching time. The intention is also to permit a defined undercutting, particularly of free-standing structures surrounded by trenches, e.g., for producing sensor elements. In addition, the bottom of the free-standing structures should not be etched during the undercutting.

ADVANTAGES OF THE INVENTION

Compared to the related art, the method of the present invention having the characterizing features of the main claim has the advantage that defined undercuttings are possible which permit free-standing structures to be produced in a defined and reproducible manner, it being possible to execute all the micromechanical patterning steps in one etching chamber without having to remove the silicon body in between. There is no etch attack on the free-standing structures starting from their bottoms or the side walls. Also achieved is that all the structures have a defined height which is defined by the thickness of the silicon layer applied, regardless of microloading effects, trench widths and the degree of an isotropic undercutting.

Moreover, the method of the present invention prevents corrosion problems, e.g., due to hydrofluoric acid vapors, and electrical shunts caused by undercutting of printed circuit traces. Buried conducting layers can be completely surrounded by a sufficiently thick silicon-dioxide layer to protect them from undercuttings and etch attacks.

A further advantage of the method is that deep undercuttings can also be implemented, thus permitting large distances between the structure and the silicon substrate layer. For example, in the case of a sensor, this reduces the danger of an unintentional impact of the sensor element on the layer located beneath it in the event of an overload, with subsequent irreversible adhesion to one another ("sticking"). This distance between the sensor element and the silicon layer can be selected to be so large that they never touch each other, even in the case of an overload.

DETAILED DESCRIPTION OF THE INVENTION

The method of the present invention can be carried out very advantageously in existing silicon deep-etching installations according to DE 42 41 045, so that no additional investment costs arise. In this context, by switching off the ion acceleration toward the substrate during an etching step, silicon structures can also be etched isotropically using this initially anisotropic plasma dry-etching method, to thus achieve undercutting of the silicon structures to be laid bare.

Since the etching mask applied during the etching processes, e.g., in the form of a photoresist mask on the silicon layer, is first removed after all etching is completed, during the etching, aluminum contact areas on the surface of the silicon layer, for example, are completely protected from corrosion, which otherwise is frequently unavoidable when working with etchant gases containing fluorine. Thus, a system integration can also be achieved in a particularly advantageous manner, i.e., producing a sensor element with integrated circuit on one and the same chip. Moreover, the method of the present invention for producing sensor elements, for example, is completely compatible with method steps in IC integration technology.

Since the method of the present invention prevents undercutting of conducting layers and an uncontrolled formation of etch pockets in the etched silicon layer, swimming of particles in these pockets, which otherwise can scarcely be removed again and which lead to mechanical and electrical faults in sensor elements, is already also forestalled from the standpoint of process engineering.

Further advantages and advantageous further developments of the invention come to light from the measures specified in the subclaims.

BRIEF DESCRIPTION OF THE DRAWING

Exemplary embodiments of the invention are explained in greater detail in the following description with reference to the drawing.

EXEMPLARY EMBODIMENTS

Figure 1:
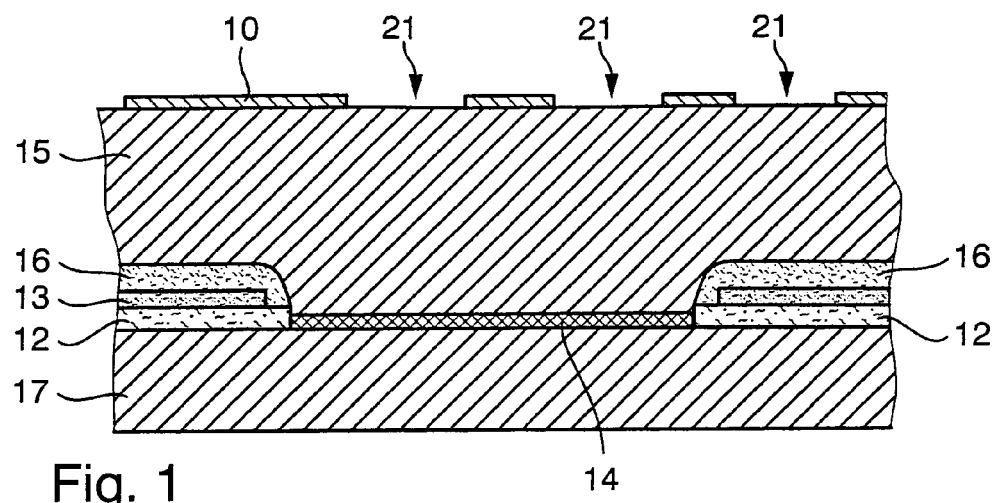
FIG. 1 shows schematically the structure of a silicon layered body with an etching mask.

FIG. 1 shows a silicon layered body having a silicon layer, which in the following is designated as further silicon layer 17, upon which a separating layer is applied that itself is made of a plurality of separating-layer sections 12, 14, 16. A first separating-layer section 12 is made of thermally oxidized silicon (so-called silicon dioxide). Located on this, region-wise, is a thin, optionally patterned conducting layer 13 of conductive, highly doped polysilicon, followed by a second separating-layer section 16 made of silicon dioxide which was produced from the vapor phase by a deposition of silanes. In the regions free of conducting layer 13, which, according to FIG. 1, are occupied by a third separating-layer section 14, first and second separating-layer sections 12, 16 have been completely etched back up to further silicon layer 17, and third separating-layer section 14 has subsequently been grown with a thickness of merely 10 nm to 100 nm at the same location, and is made of silicon dioxide. Located above separating-layer sections 12, 14, 16 is a first silicon layer 15 made of epipolysilicon. The surface of first silicon layer 15 is metal-plated and patterned with an etching mask 10 to define lateral recesses 21.

Figure 2:
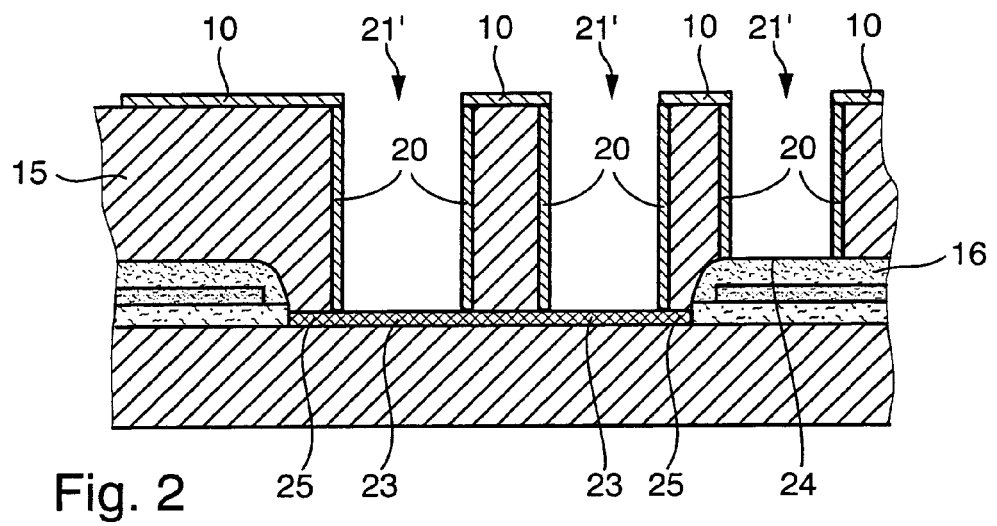
FIG. 2 shows the silicon layered body according to FIG. 1 with trenches.

FIG. 2 elucidates the result of a first anisotropic plasma etching process, having alternating deposition and etching steps, which etches trenches 21' in the region of lateral recesses 21, a Teflon-like film 20 building up on the side walls of trenches 21'. Upon reaching separating-layer sections 12, 14, 16, the first etching process comes almost to a complete standstill, since it exhibits a very high selectivity for silicon compared to silicon dioxide, and thus silicon dioxide is virtually not etched. The achieved depth of trenches 21' is thus defined in each case by the depth of buried separating-layer sections 12, 14, 16, i.e., the thickness of first silicon layer 15. Exposed regions 23 and 24, respectively, are located at the bottom of trenches 21'.

Figure 3:
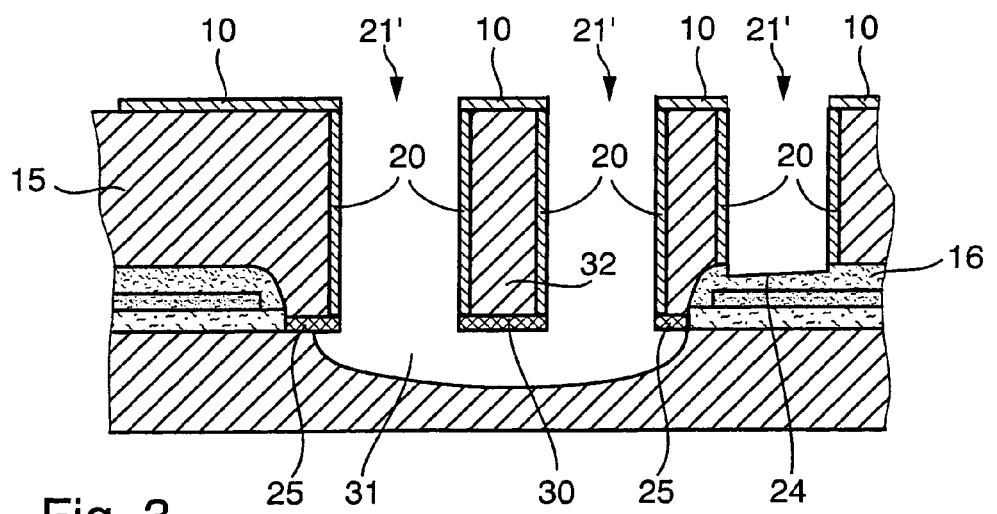
FIG. 3 shows the silicon layered body according to FIGS. 1 and 2 with an undercut starting from the exposed region of the trenches.

FIG. 3 clarifies how, in a second, for example, anisotropic plasma etching process under strong ion bombardment, exposed regions 23 of thin, third separating-layer section 14 are broken through or removed. Since second separating-layer section 16 above conducting layer 13 in exposed regions 24 is considerably thicker than third separating-layer section 14, second layer section 16 is merely slightly thinned when separating-layer section 14 is broken through. Because of this, conducting layer 13 remains completely enclosed by separating-layer sections 12, 16. After thin, third separating-layer section 14 has been broken through in exposed region 23, a further, preferably isotropic etching of further silicon layer 17 is carried out to produce a cavity 31. In so doing, a free-standing structure 32 is undercut and produced having a bottom 30 which is made of the material of separating-layer section 14. This bottom 30, possibly together with a separating-layer remainder 25 of third separating-layer section 14, as well as with Teflon-like films 20, prevents an etch-back and a structural loss of free-standing structure 32.

In the following, further details of the individual method steps are explained by way of example, corresponding to their sequence.

First of all, a thick first separating-layer section 12 is deposited on further silicon layer 17. First separating-layer section 12 preferably contains silicon dioxide, another silicon oxide, silicon nitride, glass, a ceramic or a mixture thereof, and is deposited using deposition processes generally known from semiconductor technology, and particularly by thermal oxidation according to the teaching of DE 195 37 814 A1. Further silicon layer 17 is a silicon wafer.

For example, the thickness of separating-layer section 12 is 2.5 μm. The deposited and optionally patterned, thin conducting layer 13 preferably contains conductive polysilicon which can be highly doped to improve the conductivity. A further oxide, preferably silicon dioxide, is thereupon deposited as separating-layer section 16 on this layer system. This deposition is carried out, for example, from the vapor phase using silanes according to the method known per se from DE 195 37 814 A1, and has a layer thickness of approximately 1.5 μm. Conducting layer 13 is preferably completely enclosed or buried.

In the region of third separating-layer section 14, in which a free-standing structure 32 is later to be produced by undercutting, the oxide located there is subsequently thinned to a thickness of approximately 10 nm to 100 nm. This can be effected by time-controlled etching back of separating-layer sections 12 and 16. In a further exemplary embodiment, separating-layer sections 12 and 16 are completely etched back in third separating-layer section 14 until further silicon layer 17 is reached, in order to subsequently regrow a desired thickness of third separating-layer section 14 of, for example, 10 nm to 100 nm. This growth of third separating-layer section 14 can be carried out either only in the previously etched-back regions, or else over the entire surface in the etched-back regions and on remaining second separating-layer section 16, since the thickness of grown third separating-layer section 14 is virtually negligible compared to the thickness of second separating-layer section 16. In this method variant of the complete etch-back and subsequent growth, the thickness of third separating-layer section 14, which is preferably made of thermally grown silicon dioxide, is very exactly defined.

In the preferred embodiment, first separating-layer section 12 has a greater density than second separating-layer section 16. Furthermore, the thickness of second separating-layer section 16 should be considerably greater, particularly more than ten times to one thousand times greater, than the thickness of the etched-back separating-layer section or of grown third separating-layer section 14. The thickness of first and second separating-layer sections 12 and 16, respectively, in each case lies absolutely between 500 nm to 50 µm, preferably between 1 µm to 10 µm.

In the subsequent method step, a thick first silicon layer 15, preferably of epipolysilicon, is grown on separating-layer sections 12, 14, 16, is optionally plated on the surface and, for example, is patterned with etching mask 10 to define lateral recesses 21. First silicon layer 15 can also be doped. The plated surface of first silicon layer 15 can be an aluminum contact layer which is simultaneously protected from the attack of fluorine-containing gases by etching mask 10, e.g., in the form of a photoresist mask.

Thereupon, using an anisotropic deep-etching process known per se from DE 42 41 045 or DE 44 20 962 A1 as the first etching process, trenches 21' are etched at the locations of lateral recesses 21. Upon reaching separating-layer sections 12, 14, 16 in exposed regions 23 and 24, respectively, this first etching process comes virtually to a standstill, since the etching method known from DE 42 41 045, to which this exemplary embodiment relates, exhibits a very high selectivity of approximately 200–300:1 with respect to silicon dioxide, which means that etching virtually stops on separating-layer sections 12, 14, 16 which are preferably made of silicon dioxide. In addition to the composition of the separating layer, the etching stop is determined in particular by the etching process selected. The method parameters should always be selected in such a way that etching virtually stops upon reaching separating-layer sections 12, 14, 16.

The preferred first etching process according to DE 42 41 045 is a dry etching process in which deposition steps are carried out alternating with isotropic etching steps as such, a deposition gas, preferably octafluorocyclobutane $C_4F_8$ or perfluoropropylene $C_3F_6$, supplying polymer-forming monomers being exposed during the deposition steps to a highly dense plasma, particularly a PIE plasma (propagation ion etching) or an ICP plasma (inductively coupled plasma) which builds up Teflon-like film 20 of $(CF_2)_n$ on the side walls of trenches 21'; and in which method, an etchant gas, in particular sulfur hexafluoride $SF_6$, supplying fluorine radicals is used during the etching processes, to which oxygen can be admixed for suppressing a sulfur deposition in the waste-gas zone. By propelling Teflon-like side-wall film 20 during the etching steps which are isotropic as such, these steps become locally anisotropic.

In a second etching process, separating-layer sections 12, 14, 16 are now further etched in exposed regions 23 and 24, respectively, with an etching process suitable for etching the composition of the separating layer. This further etching is carried on until separating-layer section 14 is completely etched through in exposed regions 23. This is preferably done by a plasma etching method with an etching device according to the teaching of DE 42 41 045, using etching gases $CF_4$, $C_2F_6$, $C_3F_8$, $CHF_3$, $C_3F_6$ or $C_4F_8$, with application of strong ion bombardment, i.e., high substrate bias voltage. Particularly when using fluorine-rich etchant gases $CF_4$, $C_2F_6$, $C_3F_8$, or a mixture of $CF_4$ and $CHF_3$, this oxide etching process is unproblematic for the state of the plasma etching chamber with respect to subsequent silicon etchings. If, for example, for reasons of higher selectivity, the intention is to use fluorine-poorer oxide etchant gases $CHF_3$, $C_3F_6$ or $C_4F_8$, the process parameters must be optimized very carefully to prevent later silicon etchings in the chamber from being poisoned by cross-contamination. However, it is also possible to carry out the oxide etching in an etching installation especially provided for this purpose. To this end, a cluster installation is used in particular, in which a single handling system serves a plurality of plasma etching chambers and in which the silicon body always remains in vacuum.

In further method variants, the oxide etching of exposed regions 23 and 24, respectively, of separating-layer sections 12, 14, 16 can also be carried out using a wet chemical treatment, in that the layer sequence, produced, for example, on a wafer, is removed from the plasma etching chamber and a silicon dioxide layer in exposed regions 23 and 24, respectively, is then etched with diluted hydrofluoric acid or a sufficiently buffered hydrofluoric acid solution, and is completely removed in exposed regions 23. However, the preferred embodiment of the invention is the etching using a dry chemical treatment with the aid of a plasma, since this method in particular does not undercut the oxide edges of bottom 30 or of separating-layer remainders 25.

When etching through third separating-layer section 14 in exposed regions 23, the separating-layer sections in exposed region 24 of second separating-layer section 16 are unavoidably partially removed as well, since this second etching process is carried out unmasked and therefore over the entire surface on all exposed regions 23 and 24, respectively. However, since second separating-layer section 16 has a considerably greater thickness of, for example, 1.5 µm compared to only approximately 50 nm of third separating-layer section 14, this etching of second separating-layer section 16 when etching through the exposed regions of thin, third separating-layer section 14 is of no importance, even given a double overetching for reasons of process reliability when etching through. Therefore, buried conducting layer 13, in particular, remains protected all over by a thick, intact silicon dioxide layer.

After third separating-layer section 14 has been etched through in exposed regions 23, according to FIG. 3, an isotropic etching of further silicon layer 17 is carried out in a third etching process. Prior to this etching, an additional passivation of the side walls of trenches 21' with a Teflon-like plasma polymer can be carried out according to the teaching of DE 44 20 962 A1, provided that this side-wall passivation did not already come about during the etching of trenches 21' according to FIG. 2 and been retained complete and undamaged when etching through third separating-layer section 14 in exposed regions 23. The isotropic etching of further silicon layer 17 is preferably an undercutting in region 31, which results in laying bare structure 32 to be exposed. No etching of bottom 30 or of the side walls of free-standing structure 32 can occur during this etching of further silicon layer 17, since bottom 30 is protected, for example, by a thin silicon dioxide layer from third separating-layer section 14, and the side walls are protected by Teflon-like film 20. The same holds true for an etch-back into first silicon layer 15, or an etch-back into conducting layer 13, which are likewise protected by separating-layer remainders 25 not etched through in the second etching process.

Specifically, the third etching process for the isotropic etching of further silicon layer 17 is carried out by initially removing remainders of a fluoropolymer possibly still present on further silicon layer 17 after etching through third separating-layer section 14. This is done by letting argon and/or oxygen into the etching chamber for a short time and igniting the plasma again. In so doing, polymer is very quickly removed selectively on the etching ground by ion action in a generally known manner, resulting in a polymer-free further silicon layer 17 and a side-wall passivation by Teflon-like films 20 which continues to be intact. The presence of oxygen promotes this physical etching removal by directed ions, in that chemical reactions are induced between fluorocarbons and oxygen. Thereupon, an isotropic silicon etching method with a fluorine plasma is carried out in a manner known per se according to DE 42 41 045, and $SF_6$ plasma being ignited in an inductive plasma source, and at the same time, the side-wall film transport mechanism known from DE 42 41 045 being forestalled by using a high process pressure and applying no substrate bias voltage. A suitable gas flow for this part of the third etching process is, for example, 100 sccm $SF_6$ at a pressure of 50 to 100 mTorr. In a variant of this etching process, the initial removal of the remainders of a fluoropolymer on further silicon layer 17 can also be carried out in the manner that the silicon etching method according to DE 42 41 045 with a fluorine plasma and the indicated parameters is started for a few seconds with a high substrate bias power of 50 to 100 W, and this substrate bias power is then completely switched off. With these means, the remainders of the fluoropolymer on further silicon layer 17 are removed within the few seconds, while Teflon-like side-wall films 20 remain essentially Alternatively the isotropic fluorine etching step in the third etching process for the isotropic etching of further silicon layer 17 after the removal of the remainders of the fluoropolymer on further silicon layer 17 can be carried out without plasma support, using etchant gases such as xenon difluoride, chlorotrifluoride, bromine trifluoride or iodine pentafluoride which, as is known, immediately attack free silicon areas isotropically in vigorous reaction, forming volatile silicon tetrafluoride. The selectivity of these gases with respect to non-silicon is extremely high, so that the thinnest passivation layers are already sufficient for protecting from etch attacks.

Since in the isotropic undercutting, the silicon dioxide remains at bottom 30 of structure 32 to be exposed, third separating-layer section 14 must be as thin as possible so as not to disadvantageously influence the mechanical properties of free-standing structure 32 which, for example, can be used as a sensor element. A practicable lower limit of the thickness is approximately 10 nm. In addition, due to the silicon-dioxide layer at bottom 30 of free-standing structure 32, a compressive strain is induced which causes a slight curvature of bottom 30 upward. Given a layer thickness of approximately 10 nm, this curvature is negligible in most cases. However, it is also possible to completely compensate for this compressive strain by a doping of first silicon layer 15 from above.

Due to the method of the present invention, free-standing structures 32 have a height, in particular, which is determined only by the thickness of first silicon layer 15, and is independent of microloading effects, the degree of isotropic etching and undercutting, respectively, and the trench widths.

After removal from the plasma etching installation, etching mask 10, e.g., in the form of a photoresist mask, and the remaining passivating Teflon-like films 20 are removed from the etched silicon body in an oxygen plasma stripper with the aid of an oxygen plasma ashing process known in semiconductor technology. Thus, not until this stage are the plated surface of first silicon layer 15 and aluminum contact areas optionally applied there, which previously were lying under etching mask 10 from corrosion and etch attacks, also laid bare. Therefore, any aftertreatment of these contact areas can be eliminated. This method is particularly suited for producing sensor elements having free-standing structures, in which the associated integrated circuit is arranged on the same wafer.

Since Teflon-like films 20 represent an excellent means for preventing irreversible bonding of micromechanical structures upon contact of silicon with silicon ("sticking"), for many applications it is advisable for these Teflon-like films 20, which are also removed when removing etching mask 10 in an oxygen ashing process, to be applied again later by a fresh Teflon coating. This can already be done in the oxygen plasma stripper by, in conclusion, instead of oxygen, letting in for a short time a gas such as $C_3F_6$, $C_4F_8$ or $CHF_3$ supplying Teflon-forming monomers, and igniting the plasma again. Because of this, however, an aluminum plating on the surface of silicon layer 15 is also covered with Teflon, which can cause problems during a later contacting. Therefore, in a particularly advantageous refinement of the invention, after the oxygen ashing process, Teflon-like films 20 are again applied over the entire surface on all accessible silicon areas with the deposition step already known from DE 42 41 045 in the etching reactor, and subsequently removed again with the aid of a short-duration, strong ion bombardment on all areas accessible for the normal ionic incidence, so that Teflon-like films 20 are retained only on the side walls of free-standing structure 32, bottom 30 and all silicon- or silicon-oxide areas shadowed from the ionic incidence. Consequently, contact areas, in particular, are freed again from an unwanted Teflon coating. Alternatively, instead of later removing the Teflon-like films on all locations accessible for the normal ionic incidence, it can also be very advantageous to use an ionic bombardment already during the application of the Teflon-like films according to DE 42 41 045 in the etching reactor, so that in particular, the Teflon-like films really do not form at all on the contact areas (selective coating of the side walls).

Figure 4:
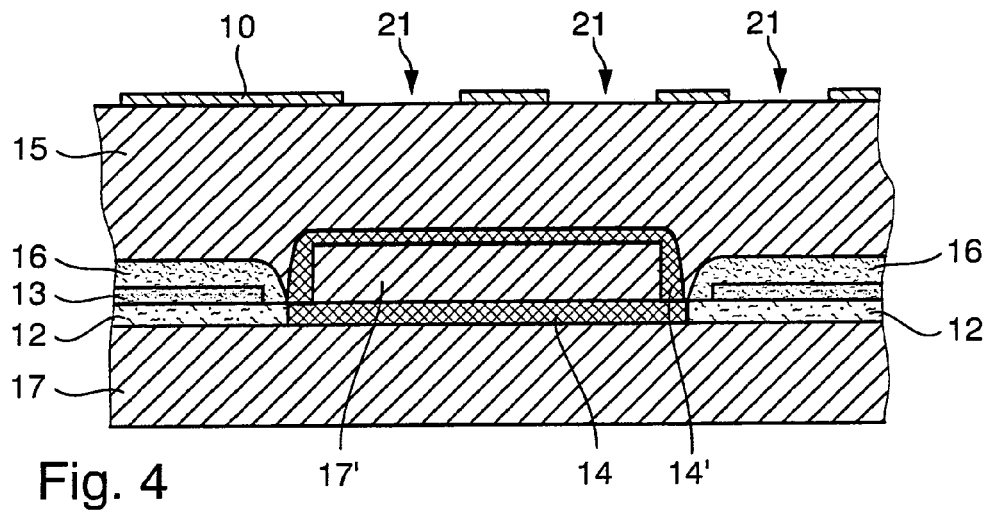
FIG. 4 shows the structure of a silicon layered body with a completely enclosed intermediate layer as sacrificial layer.
Figure 5:
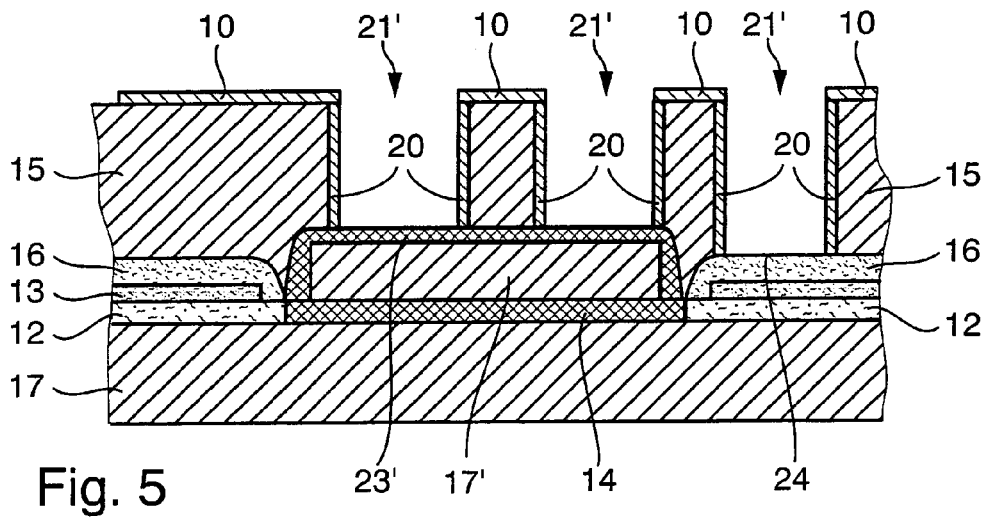
FIG. 5 shows the silicon layered body according to FIG. 4 with etched trenches.
Figure 6:
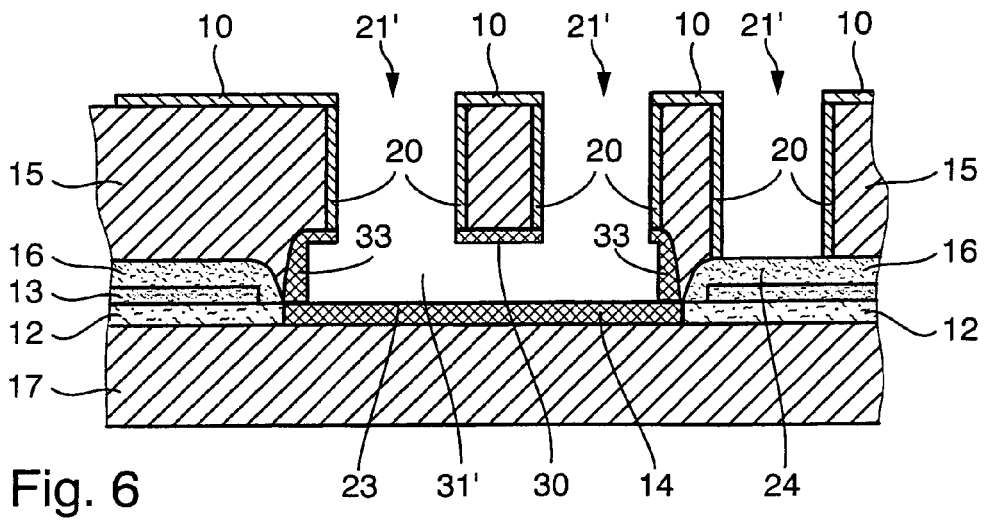
FIG. 6 shows the silicon layered body according to FIGS. 4 and 5, respectively, with an undercut that starts from the exposed region of the trenches and is bounded laterally and vertically by separating layers.

As a further exemplary embodiment, FIGS. 4, 5 and 6 show a variant of the exemplary embodiment described with the aid of FIGS. 1 through 3, this exemplary embodiment differing from that one in that, before growing first silicon layer 15, initially an intermediate layer is additionally applied as a further silicon layer on third separating-layer section 14 using generally known deposition and patterning methods, and is subsequently surrounded on the surface and sides by a further separating layer 14'. Intermediate layer 17', used as a sacrificial layer, can be patterned according to the geometry needed. In this variant, third separating-layer section 14 can correspond very advantageously to first separating-layer section 12 with respect to thickness and composition, since further separating layer 14' now assumes the role of third separating-layer section 14 from the exemplary embodiment according to FIGS. 1 through 3. Consequently, further separating layer 14' is made, in particular, of thermally grown silicon dioxide having a thickness of 10 nm to 100 nm. In this respect, an etch-back of third separating-layer section 14, or a growth of third separating-layer section 14 after a complete etch-back up to further silicon layer 17, as explained in the exemplary embodiment according to FIGS. 1 through 3, is no longer necessary, since not the third separating-layer section 14, but rather further separating layer 14' is etched through in the second etching process, and the third etching process therefore causes etching of intermediate layer 17' as the further silicon layer. Particularly advantageously, intermediate layer 17' can now also be patterned out from conducting layer 13 which is made of polysilicon, so that an additional process step for growing intermediate layer 17' is eliminated.

For example, intermediate layer 17', used as the sacrificial layer, has a composition like further silicon layer 17. It can also be made of polysilicon or epipolysilicon in accordance with conducting layer 13 or first silicon layer 15. Therefore, corresponding to the preceding exemplary embodiment, the first etching process stops in exposed regions 23' on further separating layer 14', as well as on exposed regions 24. In the second etching process, according to FIGS. 5 and 6, this thin further separating layer 14' is then again broken through in exposed regions 23' in an anisotropic plasma etching process corresponding to the preceding exemplary embodiment, under strong ion bombardment. Finally, as shown in FIG. 6, using a third etching process corresponding to the preceding exemplary embodiment, a further isotropic etching of intermediate layer 17', used as the sacrificial layer, is then carried out, which in the exemplary embodiment according to FIG. 3, would correspond to the isotropic etching of further silicon layer 17 for producing cavity 31. Because intermediate layer 17' in this exemplary embodiment is initially completely enclosed by separating layer 14' and third separating-layer section 14, respectively, in the third etching process, the etching stops automatically after intermediate layer 17', used as the sacrificial layer, is completely etched away, so that on one hand, a free-standing structure 32 having defined bottom 30 and defined side walls is formed, and on the other hand, a cavity 31' is formed having edges 33 that are exactly defined laterally and vertically on the basis of the patterning, i.e., the geometry and thickness of further separating layer 14'.

Figure 7:
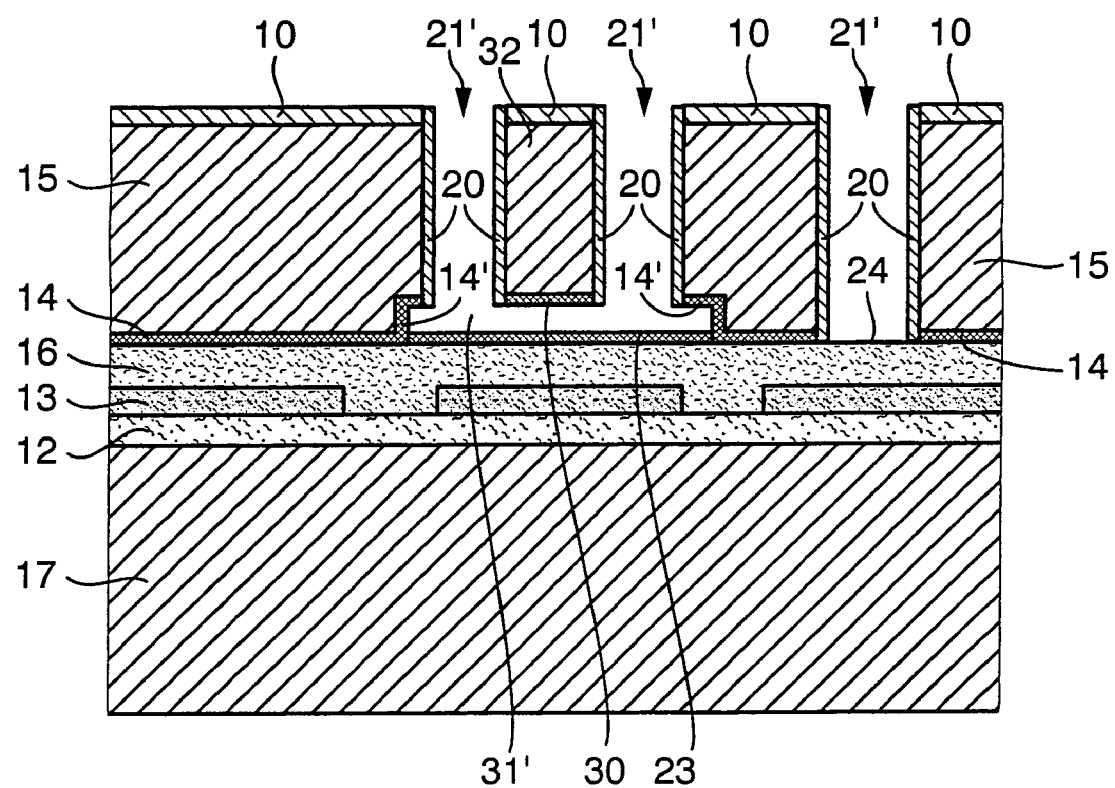
FIG. 7 shows a variant of the structure of the silicon layered body corresponding to FIG. 6, the separating layer being formed continuously with a thin, patterned conducting layer enclosed therein.
Figure 8:
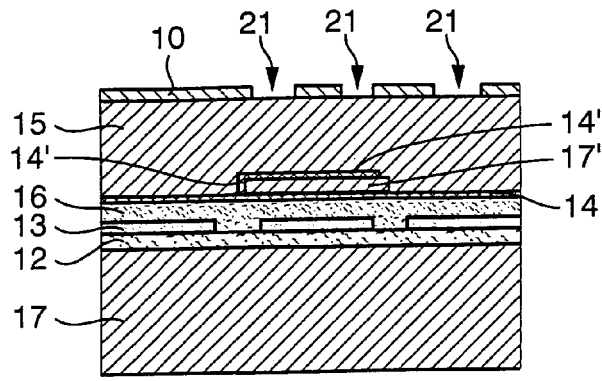
FIGS. 8 through 11 illustrate another exemplary embodiment as a further development of the exemplary embodiment according to FIG. 7, an undercut starting from an intermediate layer into the free-standing structures being purposefully permitted by interrupting the separating layer.

According to a further exemplary embodiment, which otherwise is largely analogous to the exemplary embodiment according to FIGS. 4, 5 and 6, and which is explained with the aid of FIG. 7, separating layer 12, 14, 16 is formed continuously with uniform thickness on further silicon layer 17, and optionally-patterned conducting layer 13 is enclosed therein. Analogous to FIG. 4 and the preceding exemplary embodiment, the intermediate layer is then additionally applied as further silicon layer on this separating layer 12, 14, 16 using generally known deposition and patterning methods, and is subsequently surrounded on the surface and sides by further separating layer 14' which, for example, is produced by thermal growth of a silicon dioxide layer. The composition of this further separating layer 14' and its thickness in turn preferably correspond to that of third separating-layer section 14. Intermediate layer 17' is composed, in particular, like further silicon layer 17, conducting layer 13 or first silicon layer 15.

Thus, this variant of the method according to the invention makes it possible to place electrode areas under active or free-standing structures, an optionally patterned plane with intermediate layer 17' as sacrificial layer being freely available which is removed for producing free-standing structures 32, as well as a plane, located under it, having electrode and printed-circuit-trace geometries which are protected, in particular, from etch attacks by separating-layer sections 12, 14, 16. Therefore, patternings can be carried out independently of one another in both planes. Furthermore, after the removal of intermediate layer 17', all electrically functional, patterned conducting layers 13 are still present, completely electrically insulated to all sides.

A further advantageous development of the invention is illustrated as exemplary embodiment on the basis of FIGS. 8 through 11, the various etching processes, layer compositions and layer thicknesses being selected as already explained in the preceding exemplary embodiments. However, in further development of FIG. 7 (see FIG. 8), this example provides that, due to a suitable, generally known patterning of further separating layer 14', said further separating layer 14' and third separating-layer section 14 do not completely enclose intermediate layer 17'.

Figure 9:
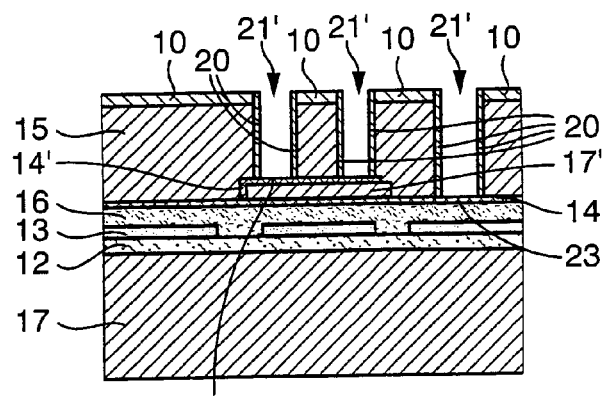
Figure 10:
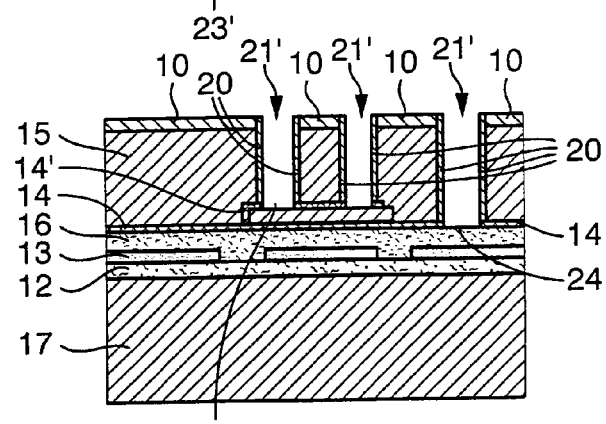

The layered structure of the layered body shown is implemented in detail as already described in the preceding exemplary embodiments. Thereupon, as shown in FIG. 9, trenches 21' are produced in a first etching process, accompanied by simultaneous buildup of the side-wall passivation by Teflon-like films 20, the first etching process coming to a standstill at bottom 23' of trenches 21'. In the second etching process, thin, further separating layer 14' is then broken through at bottom 23' of trenches 21'. In so doing, third separating-layer section 14 is also simultaneously etched at bottom 23 at the locations at which a further separating layer 14' lying above is missing. However, in view of the slight thickness of further separating layer 14' and of second separating-layer section 16 present below third separating-layer section 14, this etching is negligible.

Figure 11:
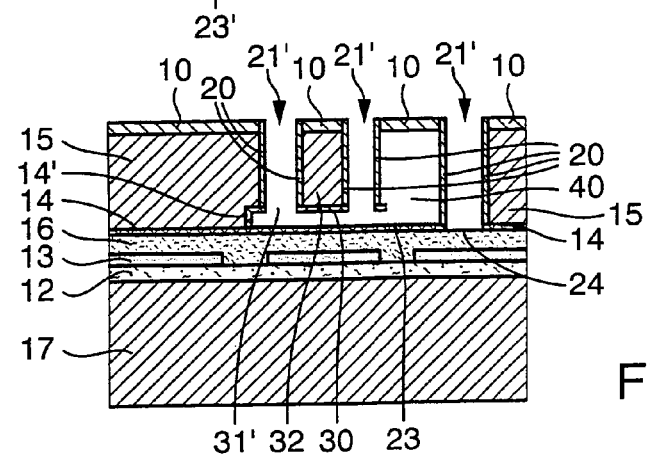

In this exemplary embodiment, in an advantageous further development of the invention, it is possible in particular to completely dispense with third separating-layer section 14, since its task is assumed by further separating layer 14' and by second separating-layer section 16. After breaking through further separating layer 14' at bottom 23' of trenches 21', the second etching process is interrupted. Following is the third etching process, already previously described, which etches intermediate layer 17' used as the sacrificial layer. In this context, the etch attack in the third etching process is restricted to the region bounded by thin, further separating layer 14' and third separating-layer section 14 or second separating-layer section 16; in this exemplary embodiment, however, differing from FIG. 7, the patterning of further separating layer 14' also makes it possible to very advantageously carry out an etching coming from below within a rib 40. In so doing, the advance of the etching front in rib 40 is restricted by the side-wall passivation due to the Teflon-like films 20 and by the upper passivation of ribs 40 by etching mask 10, so that rib 40 is largely hollowed out or interrupted locally as the etching progresses. Consequently, by selective omission or a defined patterning of further separating layer 14', this exemplary embodiment of the invention selectively permits an etch attack from below in the third etching process. Therefore, as shown in FIG. 11, for example, an initially produced silicon bridge can be selectively cut through from below by an etch attack under an aluminum plating, present on the surface in the first silicon layer 15 and constructed in the form of dielectrically insulated printed circuit traces. Thus, a free printed circuit trace is obtained, at least locally, which is available for further contacting, as well as an electrical isolation of free-standing structure 32 from the surrounding silicon. Therefore, this exemplary embodiment offers new possibilities and advantages, particularly from the standpoint of integration, i.e., the use of micromechanics with electronic circuit technology.

Particularly when the surface aluminum plating is separated from actual first silicon layer 15 by an additional, suitably patterned, electrically insulating intermediate layer made, for example, of silicon dioxide —this intermediate layer not being etched during the third etching process—it is possible to selectively achieve an electrical connection and, in particular, an interface connection of a sensor to an electronic evaluation circuit via a surface plating of first silicon layer 15, which is stretched like a bridge over an abyss and is protected from below by the electrically insulating intermediate layer not etched in the third etching process.

What is claimed is:

1. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein a first and a second section (12, 14) of the separating layer (12, 14, 14', 16) are deposited in such a manner, that the conducting layer (13) is completely enclosed.

2. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein the first silicon layer (15) is made of epipolysilicon, which is at least one of doped on the surface, metallized on the surface and patterned.

3. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process than etching the further silicon layer (17, 17'); wherein the separating layer (12, 14, 14', 16) is made of at least one first separating-layer section (12) and one second separating-layer section (16); the first separating-layer section (12) containing at least one of silicon dioxide, another silicon oxide, silicon nitride, glass, a ceramic, and a mixture thereof, and being deposited using deposition methods known from semiconductor technology; the second separating-layer section (16) preferably being a silicon-dioxide layer; and the first separating-layer section (12) being deposited on the further silicon layer (17), a conducting layer (13) preferably made of conductive, highly doped polysilicon then being deposited and possibly patterned on at least some regions of the first separating-layer section, and the second separating-layer section (16) subsequently being deposited on the conducting layer (13).

4. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein the separating layer (12, 14, 14', 16) is made of at least one first separating-layer section (12) and one second separating-layer section (16), the first separating-layer section (12) containing at least one of silicon dioxide, another silicon oxide, silicon nitride, glass, a ceramic, and a mixture thereof, and being deposited using deposition methods known from semiconductor technology, and the second separating-layer section (16) preferably being a silicon-dioxide layer; and the separating-layer sections (12) and (16) each have a thickness of 500 nm to 50 μm, preferably 1 μm to 10 μm.

5. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein the separating layer (12, 14, 14', 16) is made of at least one first separating-layer section 912) and one second separating-layer section (16), the first separating-layer section (12) containing at least one of silicon dioxide, another silicon oxide, silicon nitride, glass, a ceramic, and a mixture thereof, and being deposited using deposition methods known from semiconductor technology, and the second separating-layer section (16) preferably being a silicon-dioxide layer; and, in the vicinity of at least one of trench (21') and an exposed structure (32), at least one of the first and the second separating-layer section (12, 16) are one of thinned by etching back to an etched-back separating-layer section having a thickness of 10 nm to 100 nm, and completely removed and, instead, a third separating-layer section (14) is grown, which has a lesser thickness and is preferably made of silicon dioxide.

6. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein the depth of the trenches (21') etched in the first etching process is independent of the ratio of the width to the height of the trenches (21'), and is adjusted by the etching time for reaching the exposed regions (23, 23') of one of the first separating-layer section (16), the grown, third separating-layer section (14), and the further separating layer (14').

7. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating later (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein, in an oxygen-plasma stripper, the etched silicon-layer body is freed from the etching mask (10) and remaining $(CF_2)_n$ films (20), using an oxygen ashing process, and a $(CF_2)_n$ coating is subsequently deposited on the side walls of a produced, free-standing structure (32), on the side walls of the trenches (21'), and on all of the surfaces shadowed by normal ionic incidence, in the course of which electrical contact surfaces, in particular, remain free from a $(CF_2)_n$ coating.

8. The method as recited in claim 1, wherein the third etching process produces a completely isotropic undercut, at least between two trenches (21'), so that a free-standing structure (32) is formed.

9. The method as recited in claim 1, wherein the first etching process is a dry etching process in which deposition steps are carried out in alternation with isotropic etching steps known per se, a deposition gas, preferably one of octafluorocyclobutane $C_4F_8$ and perfluoropropylene $C_3F_6$, which supplies polymer-forming monomers, being exposed during the deposition steps to a highly dense plasma, particularly one of a PIE plasma (propagation ion etching) and an ICP plasma (inductively coupled plasma), which builds up a $(CF_2)_n$ film on the side walls of the trenches (21'); and an etchant gas, in particular sulfur hexafluoride $SF_6$ with admixed oxygen, which supplies fluorine articles, is used during the etching processes.

10. The method as recited in claim 1, wherein the first anisotropic etching process of the trenches (21') has a high selectivity with respect to silicon dioxide.

11. The method as recited in claim 1, wherein the separating layer (12, 14, 14', 16) is made of at least one first separating-layer section (12) and one second separating-layer section (16), the first separating-layer section (12) containing at least one of silicon dioxide, another silicon oxide, silicon nitride, glass and a ceramic and being deposited using deposition methods known from semiconductor technology, and the second separating-layer section (16) preferably being a silicon-dioxide layer.

12. The method as recited in claim 1, wherein the second etching process for etching through the separating layer (12, 14, 14', 16) in the exposed region (23, 23') of the trenches (21') is implemented in a dry-chemical manner, preferably using plasma etching.

13. The method as recited in claim 12, wherein the plasma etching is carried out under strong ion bombardment, and with the aid of an etching gas selected from the group consisting of $CF_4$, $C_2F_6$, $C_2F_8$, $CHF_3$, $C_3F_6$ and $C_4F_8$.

14. The method as recited in claim 1, wherein the second etching process for etching through the separating layer (12, 14, 14', 16) in the exposed region (23, 23') of the trenches (21') is implemented in a wet-chemical manner, and particularly with the aid of one of dilute hydrofluoric acid and dilute hydrofluoric-acid.

15. The method as recited in claim 8, wherein the free-standing structure (32) has a base (30), which is at least largely free of an etchant tack during etching, particularly during the undercutting in the third etching process.

16. The method as recited in claim 1, wherein one of prior to and during the third etching process, the side walls of the trenches (21') are selectively coated with a plasma polymer, prior to the undercutting in order to produce a $(CF_2)_n$ film (20).

17. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least about to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein a $(CF_2)_n$ film (20) being built up on side walls of the trenches (21') at least one of in the course of the first etching process, prior to the third etching process and during the third etching process; wherein the first and second separating-layer sections (12, 16) are deposited in such manner that the conducting layer (13) is completely enclosed.

18. The method as recited in claim 3, wherein the second separating-layer section (16) is deposited from the vapor phase, in particular by decomposition of silanes.

19. The method as recited in claim 3, wherein the first separating-layer section (12) is formed from thermally grown silicon dioxide.

20. The method as recited in claim 5, wherein the third separating-layer section (14) is produced with a thickness of 10 nm to 100 nm.

21. The method as recited in claim 5, wherein the first silicon layer (15) is grown on the second separating-layer section (16) and one of the etched-back separating-layer section and the grown, third separating-layer section (14).

22. The method as recited in claim 5, wherein the second separating-layer section (16) is thicker, in particular more than ten times to one thousand times thicker, than one of the etched-back separating-layer section and the third separating-layer section (14).

23. The method as recited in claim 1, wherein a plated surface of the first silicon layer (15) is an aluminum contact layer, which is protected from the attack of fluorine-containing gases by a photo resist mask as etching mask (10).

24. The method as recited in claim 1, wherein the depth of the trenches (21') etched in the first etching process is independent of the ratio of the width to the height of the trenches (21'), and is set by the etching time for reaching the exposed regions (23, 23') of one of the first separating-layer section (16), the grown, third separating-layer section (14), and the further separating layer (14').

25. The method as recited in claim 1, wherein all of the etching processes are carried out in a single etching chamber and the silicon layered body remains in the etching chamber during the etching process.

26. A method for etching a silicon layered body, which has a first silicon layer (15) that is provided with an etching mask (10) for defining lateral recesses (21); work with a plasma being carried out in a first etching process, and trenches (21') being formed by anisotropic etching in the region of the lateral recesses (21); at least one separating layer (12, 14, 14', 16) being buried between the first silicon layer (15) and a further silicon layer (17, 17'), and the first etching process coming at least almost to a standstill upon reaching the at least one separating layer; and the separating layer (12, 14, 14', 16) subsequently being etched through in an exposed region (23, 23') by a second etching process, and a third etching process then etching the further silicon layer (17, 17'); wherein a $(CF_2)_n$ film (20) being built up on side walls of the trenches (21') at least one of in the course of the first etching process, prior to the third etching process and during the third etching process; wherein the etching mask (10) and the remaining $(CF_2)_n$ films (20) are finally removed from the etched silicon layered body in an oxygen plasma stripper, using an oxygen ashing process; wherein, after the removal of the remaining $(CF_2)_n$ films, a $(CF_2)_n$ coating is applied to the side walls of the free-standing structure (32), the side walls of the trenches (21'), and all surfaces shadowed by normal ionic incidence, in the course of which electrical contact surfaces, in particular, remain free from a $(CF_2)_n$ coating.

27. The method as recited in claim 21, wherein, prior to growing the first silicon layer (15) on one of the grown, third separating-layer section (14) and the etched-back separating-layer section, an intermediate layer (17'), which forms the further silicon layer as a sacrificial layer, is initially applied, and this intermediate layer (17') is subsequently covered with a further separating layer (14'), at least in the exposed regions (23, 23').

28. The method as recited in claim 27, wherein the intermediate 17') is grown from one of the group consisting of silicon, epipolysilicon, polysilicon, and conductive polysilicon.

29. The method as recited in claim 27, wherein the further separating layer (14') is formed thermally grown silicon dioxide.

30. The method as recited in claim 27, wherein the further separating layer (14') has a thickness of 10 nm to 100 nm.

31. The method as recited in claim 27, wherein, due to a patterning of the further separating layer (14'), the intermediate layer (17') is not completely surrounded by the further separating layer (14') and a separating-layer section (14, 16).

32. The method as recited in claim 27, wherein said method is adapted for producing sensor elements having free-standing structures (32).

* * * * *

UNITED STATES PATENT AND TRADEMARK OFFICE
CERTIFICATE OF CORRECTION

| | |
|---|---|
| PATENT NO. | : 7,052,623 B1 |
| APPLICATION NO. | : 09/581663 |
| DATED | : May 30, 2006 |
| INVENTOR(S) | : Volker Becker et al. |

It is certified that error appears in the above-identified patent and that said Letters Patent is hereby corrected as shown below:

Column 1, line 24, change "Disadvantages" to --Disadvantageous--

Column 1, line 33, change "can act very" to --can act very corrosively.--

Column 3, line 12, change "....OF THE DRAWING" to --OF THE DRAWINGS--

Column 6, line 13, change "in which the. silicon" to --in which the silicon--

Column 7, line 16, change "DE 42 41 045, and" to --DE 42 41 045, an--

Column 7, line 32, change "remain essentially" to --remain essentially unchanged.--

Column 11, line 54, change "etching process than etching" to --etching process then etching--

Column 12, line 40, change "layer section 912)" to --layer section (12)--

Column 16, line 18, change "is formed thermally grown silicon" to --is formed from thermally grown silicon--

Signed and Sealed this

Twenty-second Day of May, 2007

JON W. DUDAS
*Director of the United States Patent and Trademark Office*